United States Patent [19]

De Marca et al.

[11] Patent Number: 4,791,654
[45] Date of Patent: Dec. 13, 1988

[54] RESISTING THE EFFECTS OF CHANNEL NOISE IN DIGITAL TRANSMISSION OF INFORMATION

[75] Inventors: Jose R. B. De Marca, Rio de Janeiro, Brazil; Nuggehally S. Jayant, Gillette, N.J.

[73] Assignee: American Telephone and Telegraph Company, AT&T Bell Laboratories, Murray Hill, N.J.

[21] Appl. No.: 58,728

[22] Filed: Jun. 5, 1987

[51] Int. Cl.[4] .............................................. H04B 1/66
[52] U.S. Cl. ..................................... 375/122; 381/29; 358/133
[58] Field of Search ............... 375/27.30, 122; 358/13, 358/133, 134; 340/347 AD; 381/29, 30, 34, 35

[56] References Cited

U.S. PATENT DOCUMENTS

| | | | |
|---|---|---|---|
| 3,631,520 | 12/1971 | Atal | 375/27 |
| 4,558,350 | 12/1985 | Murakami et al. | 358/133 |
| 4,560,977 | 12/1985 | Murakami et al. | 340/347 AD |
| 4,652,905 | 3/1987 | Lippel | 358/13 |
| 4,670,851 | 6/1987 | Murakami et al. | 340/347 AD |
| 4,691,329 | 9/1987 | Juri et al. | 375/122 |
| 4,710,812 | 12/1987 | Murakami et al. | 358/134 |
| 4,725,885 | 2/1988 | Conzales et al. | 375/122 |

OTHER PUBLICATIONS

*IEEE ASSP Magazine*, Apr. 1984, "Vector Quantization", Robert M. Gray, pp. 4–29.

*IEEE Spectrum*, Aug. 1986, "Coding Speech at Low Bit Rates", N. S. Jayant, pp. 58–63.

*IEEE Transactions on Information Theory*, vol. IT-15, No. 1, Jan. 1969, "Minimization of Mean-Square Error for Data Transmitted Via Group Codes", T. R. Crimmins et al, pp. 72–78.

*IEEE Transactions on Communications*, vol. COM-24, No. 1, Jan. 1976, "Analysis of Digital Errors in Nonlinear PCM Systems", N. Rydbeck et al, pp. 59–65.

Primary Examiner—Robert L. Griffin
Assistant Examiner—Stephen Chin
Attorney, Agent, or Firm—Wilford L. Wisner

[57] ABSTRACT

A method for resisting the effects of channel noise in the digital transmission of information by means of the technique known as vector quantization, in which the codebook for binary index code assignment is generated by picking a vector quantized codeword with high probability and low perceptually-related distance from a required group of nearest neighbors, assigning that codeword and those neighbors binary index codes differing only in one bit, repeating the steps just outlined for assigned binary index codes to residual codewords until the lasts assignments must be made arbitrarily. Applications include transmission of speech by coded LPC parameters and transmission of image intensity or chrominance blocks for visual images. Such systems also make possible and are attractive for memory-efficient storage of such signals.

6 Claims, 3 Drawing Sheets

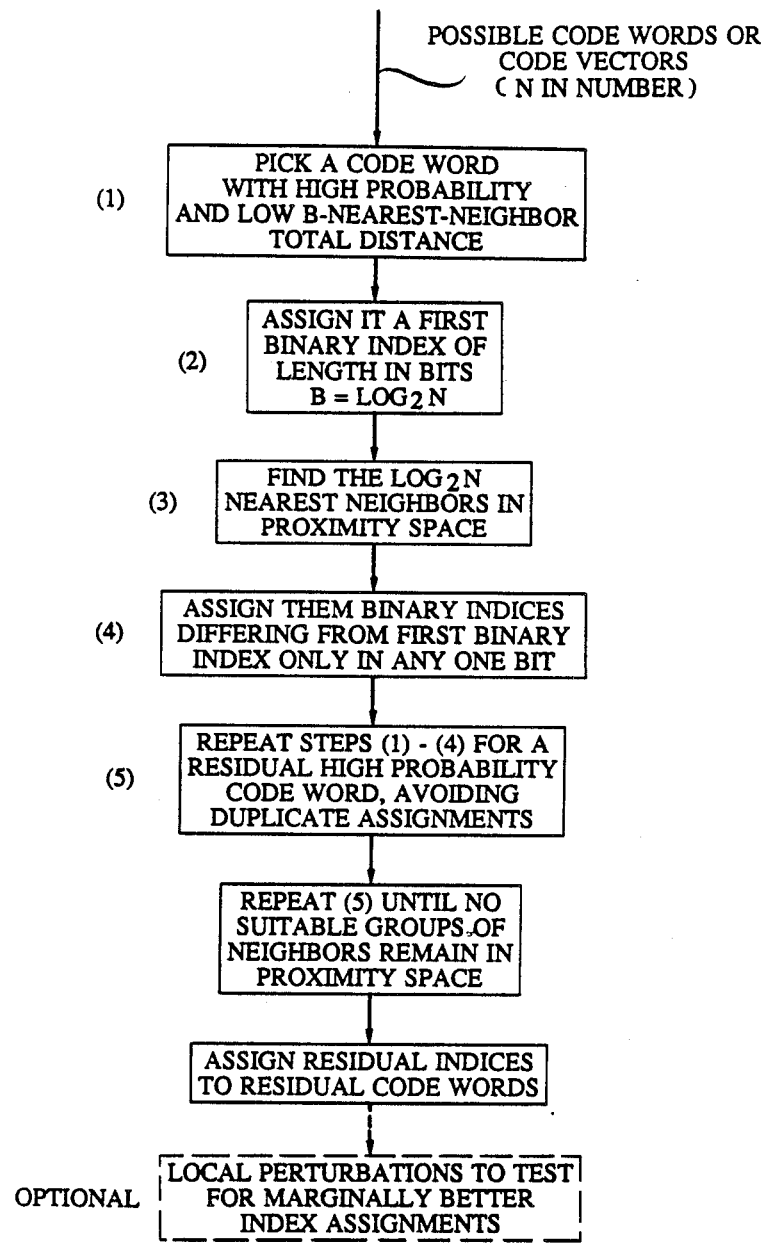

RESISTING THE EFFECTS OF CHANNEL NOISE IN DIGITAL TRANSMISSION OF INFORMATION

FIELD OF THE INVENTION

This invention relates to a method for resisting the effects of channel noise in low-bit-rate digital transmission of information, particularly in such transmission in which a coding strategy known as vector quantization is employed. By vector quantization, we mean the strategy in whih a block of information is quantized all at once, rather than sample by sample.

BACKGROUND OF THE INVENTION

Although high-bandwidth communication channels, such as optical fiber communication channels are becoming more common, and are certainly usable for relatively straight-forward techniques for transmitting high-quality voice messages and television images, coding of such information at bit rates much lower than used in the simpler pulse-code-modulated techniques will retain significant importance for the foreseeable future. One reason is the growing need to transmit information with a high level of security over low-data-rate channels such as radio links. Another is the desire for memory-efficient systems for voice storage, voice response and voice mail. Still another reason is the desire to transmit higher-quality television images over older telephone communication links which are bandwidth limited, that is, they will accept only a relatively low bit rate in the digital transmission of information. For all of these purposes, vector quantization is a very powerful candidate technique.

An excellent survey of some of the problems involved in designing vector quantization coding strategies is presented in the article "Vector Quantization" by Robert M. Gray, *IEEE ASSP Magazine*, April 1984, at pp. 4 ff.

Nevertheless, that article does not address the problems of channel noise; and the resulting coding strategies would not be expected to be particularly robust in the presence of channel noise, that is, to be resistant to the effects of channel noise. Even though that article and the article of one of us, N. S. Jayant, "Coding Speech at Low Bit Rates," *IEEE Spectrum*, August 1986, pp. 58 ff, discuss some types of distortion, channel noise can present a more severe distortion problem, in that it can change one or more bits in the transmitted binary code and change the decoded signal values to values which are perceptually far removed from the intended values.

While there have been some other analyses of digital errors for relatively low-bit-rate digital coding strategies, which do not use vector quantization as we have defined it, e.g., see T. R. Crimmins et al, "Minimization of Mean Square Error for Data Transmission via Group Codes," *IEEE Transactions on Information Theory*, Vol. IT-15, pp. 72-78, January 1969; and N. Rydberg and C. E. Sundberg, "Analysis of Digital Errors in Nonlinear PCM Systems," *IEEE Transactions on Communications*, Vol. COM-24, pp. 59-65, January 1976, no such analysis has suggested a systematic way to design the final coding for vector quantization to provide resistance to the types of errors caused by noise during transmission.

SUMMARY OF THE INVENTION

Our solution for noise-resistant coding for vector quantization is based upon our realization that the majority of errors caused by noise will involve only one bit of the binary index code that is transmitted; and our invention comprises assigning the binary index codes so that a change of one bit in the received binary index code will yield, when fully decoded, a result that is perceptually at a "minimum distance" from the intended result.

More specifically, our method addresses the design of the final coding, the selection of the so-called binary index, for vector quantization for transmission on a noisy channel, and includes the steps of picking a codeword with high probability and low B-nearest-neighbor total distance, measured by a large sample of the codewords for the initial codings of a group of data points, assigning that first high probability codeword a first binary index code from among the available choices, finding from among the other initial codewords the "nearest neighbors", in terms of the measurement which relates to the eventual perceptual proximity, which neighbors can all be assigned a unique binary index code differing from the first binary index code only in one bit, then so assigning those binary index codes, next repeating the foregoing steps each time employing a residual high probability codeword as the candidate about which nearest neighbors cluster, until only relatively isolated initial code words remain, then assigning to those remaining initial codewords the remaining binary index codes. By "relatively isolated" we mean that a sample attempt at repeating the process cannot find a group of nearest neighbors, or at least they cannot be assigned binary index codes differing by only one bit. The results are then stored in the binary index codebooks of the transmitter and receiver.

BRIEF DESCRIPTION OF THE DRAWING

FIG. 3 shows a flow diagram of the steps of the method of our invention.

DETAILED DESCRIPTION

Figure 1:
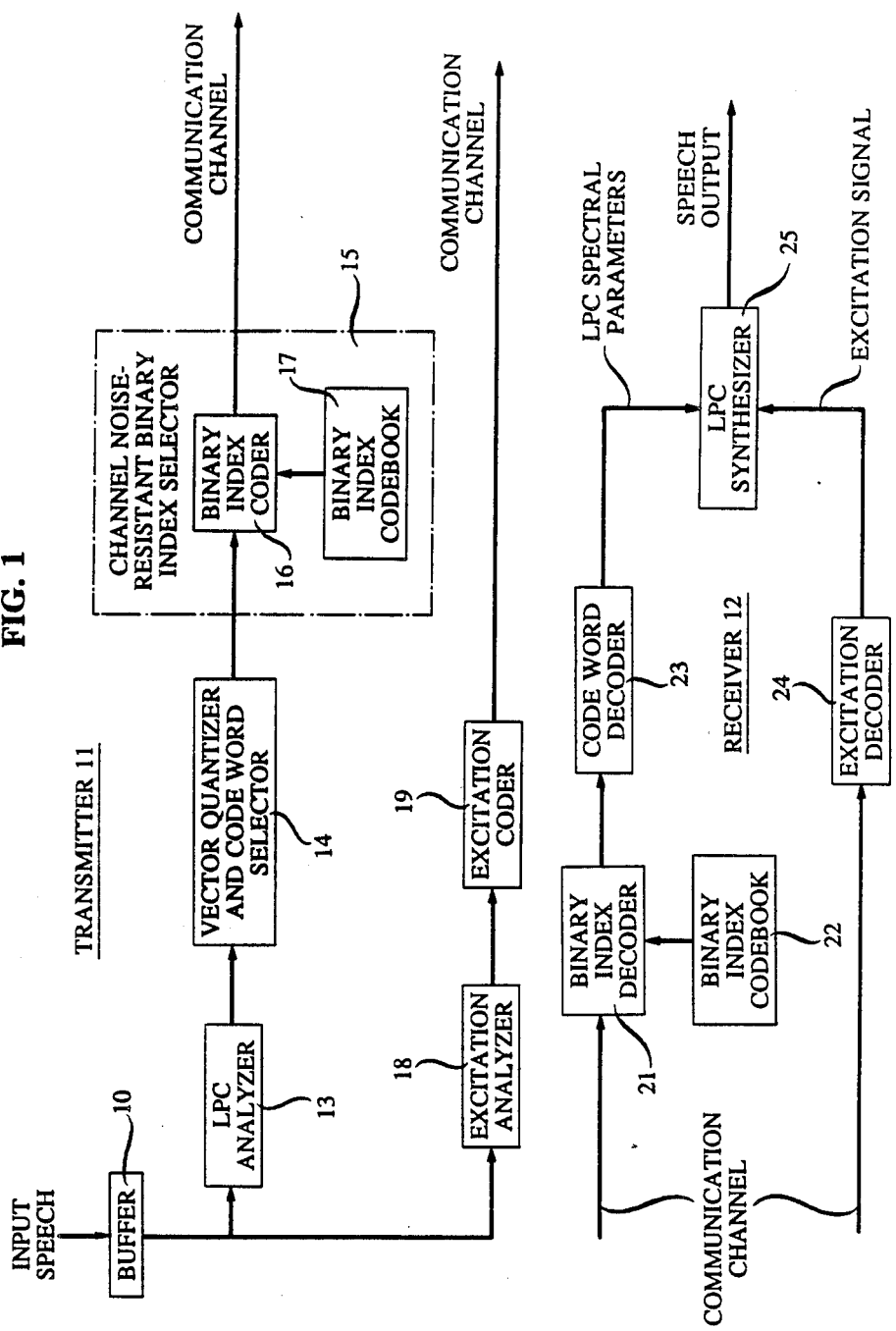
FIG. 1 shows a block diagram of a system for low-bit-rate transmission of speech employing our invention for the quantization of LPC parameters.

In the system of FIG. 1, the transmitter 11 is to analyze, code and transmit input speech into a relatively bandwidth-limited and noisy communication channel, indicated schematically at the right side of the transmitter 11 and continued at the left side of receiver 12.

The successive appropriate blocks of speech needed for subsequent operations are passed by buffer 10 to LPC analyzer 13 and excitation analyzer 18.

The slowly varying spectral parameters of the speech are exttracted by LPC analyzer 13, which can employ any of the currently available techniques. For example, see U.S. Pat. No. 3,631,520, issued Dec. 28, 1971 to B. S. Atal.

The vector quantizer and codeword selector 14, from a block of samples from analyzer 13, selects a best match to the input block of samples from a similar but limited set of combinations known as the vector quantizer codebook, and outputs the selected codeword. For such quantizing and coding, the above-referenced article by Gray is instructive. In such coding schemes, it is readily determined which codewords occur with relatively high probability and, of those, which groups will be decoded as perceptually similar sounds.

The output of selector 14 is applied to binary index coder 16, for which the codebook 17 is indicated separately to emphasize where we electronically store, in the first instance, the novel results of our method.

Excitation analyzer 18 and excitation coder 19 are illustratively those disclosed in the copending application of B. S. Atal et al, Ser. No. 810,920, filed Dec. 26, 1985.

In the receiver 12, the binary index decoder 21 performs the inverse operation of coder 16 in transmitter and therefore requires a codebook 22, wherein is stored information identical to that in codebook 17 of transmitter 11. Again, codebook 17 contains the novel results of our method.

Codeword decoder 23 performs the inverse operation to that of codeword generator 14 in transmitter 11, with the qualification that the quantizing error of the transmitter cannot be reversed.

Excitation decoder 24 performs the inverse operation of coder 19 of transmitter 11, so that the resulting signal when applied to LPC synthesizer 25, with the signal from decoder 23 setting certain synthesizer or filter parameters, will reproduce a good approximation of the input speech.

The operation of the system of FIG. 1 differs from that of the prior art as follows:

The vector quantizer will be assumed to act upon a block of M input samples ($S_{kM+1}$, $S_{kM+2}$, ..., $S_{(k+1)M}$), where k is the value of the time parameter. Each block of input samples will be represented by a vector $y_i$ which is drawn from a codebook C:

$$C = \{c_1, c_2, \ldots, c_N\} \quad (1)$$

The number of elements in C is N, and it is determined by the number of bits/block (bits/vector) B, which in turn is the product of the number of samples M in the input block and the desired number of bits/sample R:

$$N = 2^B, \; B = MR \quad (2)$$

For example, if N=1024, B=10; and further, if M=20, R=0.5 bit per sample.

Here it is being implicitly assumed that the representation levels will be binary encoded for transmission or storage. The rate in bits/s required to transmit the output of the quantizer is then $Rf_s$, where $f_s$ is the sampling rate.

Note that this model also applies to scalar quantizers, where M=1 and the codebook is the set of scalar output levels of the quantizer. The represntation vectors $y_i$ are encoded into binary words of length B and then transmitted over a channel.

The noisy digital channel will be modeled as a memoryless binary symmetric channel. This model is appropriate not only for channels where the fates of successive bits are indeed independent events, but also for systems which apply interleaving to reduce (or erase) the channel memory. Finally, the probability of occurrence of more than one bit error in a single binary word will be deemed negligible. If $p_e$ is the bit error rate, this implies that $p_eB<<1$.

The probability that the received representation z differs from the transmitted one y will be assumed to be $$p(z=c_j|y=c_l) = p_w, \; j \neq l \quad (3)$$

where $p_w$ is the probability that a word is received in error. In the single-error-per-wiord model, $p_eB<<1$, and $p_w \sim p_eB$.

In case an error does occur, the distortion introduced in the transmission of that block is $d(c_j, c_l)$. The choice of the function $d(\cdot,\cdot)$ is left to the designer of the particular image or speech encoding system. For speech signals, several distance measures have been proposed for the distortion just referred to; the most commonly used is the Itakura-Saito distortion measure for spectral distance.

With the channel model just described, the objective in designing a binary codeword assignment is to guarantee that when transmission errors occur, the distortion introduced will be as small as possible on the average. More formally, the goal is to find a mapping $b(\cdot)$, which minimizes the average distortion introduced by channel errors. This distortion is defined as:

$$D = \sum_{j=1}^{N} \sum_{j=1}^{N} p(c_i) p(c_j|c_i) d(c_i, c_j) \quad (4)$$

where $p(c_i)$ = a priori probability of codevector $c_i$ being chosen; this is a function of the statistics of the signal (or parameter) being quantized and of the codebook.

$p(c_j|c_i)$ = conditional probability that codevector $c_j$ is received given that codevector $c_i$ was transmitted.

Due to the single-error-per-word channel model, this conditional probability can take the following values:

$$p(c_j|c_i) = \begin{cases} p_w & \text{if } b(c_i) + b(c_j) \epsilon e & (5a) \\ 0 & \text{if } b(c_i) + b(c_j) \epsilon e & (5b) \\ 1 - p_w & \text{if } c_i = c_j & (5c) \end{cases}$$

where b(c) is the mapping from codevector c to bindary codeword, + denotes modulo 2 addition, and e is the set of B binary words with Hamming weight (number of non-zero elements) equal to 1.

The condition (5b) reflects the assumption that more than one bit error can never occur in one binary word. Equation (5a) reflects the assumption that a bit error is equally likely to occur in any of the B positions in the word.

The parameter $p_w$ is not explicitly used in the development of the index-assignment algorithm. The probability $p_w$ will however affect the mean squared channel-induced reconstruction error as a linear scaling parameter.

Let us assume that the index or binary word assigned to a vector $c_i$ is $a_i$. Then, in order to minimize the distortion D, the vector $c_i$ should have all its B closest neighbors assigned indices which are at Hamming distance ($d_H$) one from $a_i$. (The Hamming distance between two binary words is equal to the number of positions in which the two words differ.) In other words, if $S(c_i)$ is the set of B codevectors such that $$d(c_j, c_i) \leq d(c_l, c_i), \text{ for any } c_j \epsilon S(c_i) \text{ and } c_l \epsilon S(c_i), \quad (6)$$

then the indices for the members of $S(c_i)$ should ideally be such that:

$$b(c_j) + b(c_i) \epsilon e, \text{ all } c_j \epsilon S(c_i) \quad (7)$$

Of course, in general it will not be possible to satisfy the conditions expressed in equations (6) and (7) for all codevectors. Hence, the optimal solution will be the one which achieves the best compromise among the vectors.

In the following section, one embodiment of the index assignment method of our invention is technically described. The method attempts to guarantee indices satisfying the conditions in (6) and (7), at least for the vectors which can contribute the most to the achievement of a small average distortion D.

INDEX ASSIGNMENT METHOD

From equation (4), it can be seen that for finding a code with small average distortion D, one needs to address two considerations:

(a) The first is to guarantee that vectors with large a priori probability will have their indices as well as those of their neighbors satisfying equations (6) and (7). It is clear that if the assignment is not favorable to these vectors, the value of D can become quite large.

(b) Another factor which has to be taken into account is the distribution of codeword distances $d(c_j,c_i)$. For simplicity, we consider the sum of the distances from a vector $c_i$ to the codevectors in $S(c_i)$:

$$\alpha(c_i) = \sum_{j | c_j \in S(c_i)} d(c_j,c_i) \qquad (8)$$

Elements of C which have a small value of $\alpha$ should receive special attention to guarantee that the terms which contribute to $\alpha$ are included in D. This procedure becomes even more relevant when the input probability distribution is uniform; with the uniform distribution, the a priori probabilities of codevectors are equal, and the condiseration in (a) will be irrelevant.

Taking into account the observations in (a) and (b), an empirical function $$F(c_i) = \frac{p(c_i)}{\alpha^\beta(c_i)} \qquad (9)$$

is proposed, and it is used to order the assignment of indices to codevectors, as explained presently. The parameter $\beta \geq 0$ allows for a trade-off between the input probability and the value of $\alpha$.

Phase 0: The first (B+1) indices (i) Find the vector $c_i$ such that:

$$F(c_i) = \max_{c_j \in C} F(c_j) \qquad (10)$$

(ii) Select an index $a_i$ for $c_i$. This choice is arbitrary since no other vector has received an index.

(iii) Define $H(a_i) \triangleq \{$set of binary words $a_j$ such that Hamming distance between $a_i$ and $a_j = 1\}$. There are B binary words in this set, each differing from $a_i$ in exactly one bit position.

Assign the indices in $H(a_i)$ to the vectors $c_l \epsilon S(c_i)$.

Phase 1: The remaining $2^B - B - 1$ indices

The (B+1) assignments just made are equivalent to the establishment of one sphere of radius 1, and center corresponding to $c_i$. The remaining assignments are made by constructing other similar spheres in the N-space, and noting, wherever they exist, proximities between the points in a new local sphere and the initial sphere of Phase 1.

(iv) Eliminate $c_i$ and all $c_l$ just encoded from the list of vectors still uncoded. If this list is empty go to Phase 2.

(v) Select the codevector corresponding to the next largest value of F. Call this vector $c_i$.

(vi) If $c_i$ has not yet received a binary word, go to (vii). Otherwise, assign indices $a_l \epsilon H(a_i)$ to the vectors that belong to $S(c_i)$ and have not yet received an index. Go to (iv).

(vii) If $c_i$ has not received an index and neither have the vectors $c_l \epsilon S(c_i)$, pick an available binary word $a_i$ such that $H(a_i)$ has all its elements unused. If this is not possible, pick the index $a_i$ which has the largest subset of $H(a_i)$ still available. Assign indices from $H(a_i)$ to the members of $S(c_i)$ in increasing order of $d(c_i,c_l)$, i.e., encode first the closest neighbors, Go to (iv).

(viii) If $c_i$ has not received an index but a subset of the elements in $S(c_i)$ have already been assigned one, call this subset $\Gamma_i$. Define also as $b(\Gamma_i) = \{b(c_l) | c_l \epsilon \Gamma_i\}$.

Search for an index $a_i$ for which $b(\Gamma_i) \subset H(a_i)$. If such an $a_i$ exists assign $a_i$ to $c_i$ and go to (vi). If there is no such $a_i$, look for the set $H(a_j)$ which contains the largest subset of $b(\Gamma_i)$. If there is a tie, let $a_{nj}$, $j = 1, 2, \ldots$, be the indices which are tied. Assign to the vector $c_i$ the binary word $a_i$ such that $$\sum_{y_l | b(y_l) \epsilon b(\Gamma_i) \cap H(a_i)} d(y_l,y_i) = \min_j \sum_{y_l | b(y_l) \epsilon b(\Gamma_i) \cap H(a_{nj})} d(y_l,y_i)$$

Go to (vi)

Phase 2: Local Perturbation

This phase begins at the end of a complete solution (complete codeword assignment) based on phases 0 and 1. Since that solution is the result of a heuristic algorithm, a simple perturbation procedure was devised to investigate if, in the vicinity of the solution provided by phases 0 and 1, there exists an assignment which yields a smaller average distortion.

The method attempts to decrease D by interchanging the indices of two codevectors; it can be described as follows:

(i) $n = 1$; $m = 2$ (ii) Exchange the indices of codevectors $c_n$ and $c_m$, i.e., make $b(c_n) = a_m$ and $b(c_m) = a_n$. Compute the new value for D. If it has decreased, $a_m$ becomes the new index for $c_n$ and $a_n$ is the new binary code associated with $c_m$. Go to (iv).

If D is not reduced, maintain the old assignment.

(iii) $m = m + 1$. if $m \leq N$ go to (ii).

(iv) $n = n + 1$. If $n > N$ stop, present index assignment is the output of the algorithm. If not, make $m = n + 1$ and return to (ii).

Figure 2:
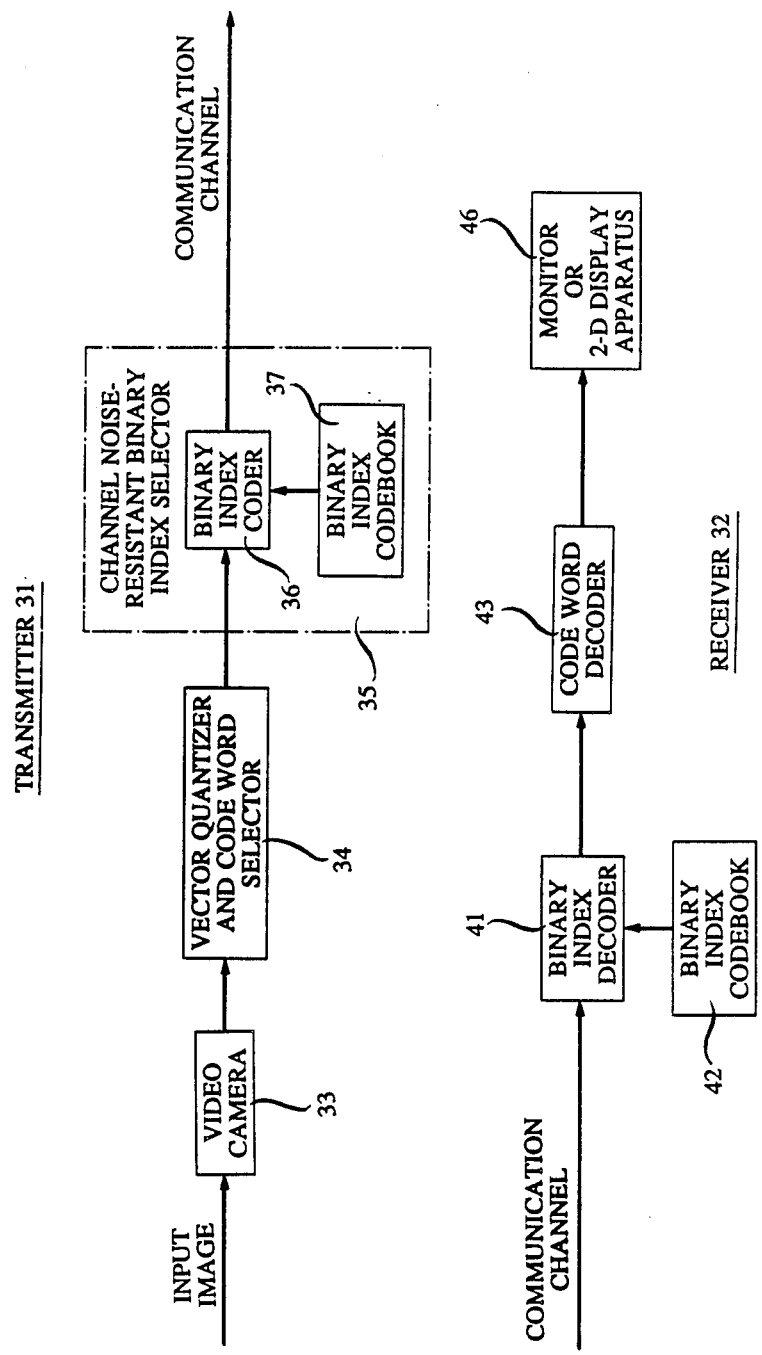
FIG. 2 shows a block diagram of a system for low-bit-rate transmission of images employing our invention for the quantization of image intensity or chrominance blocks.

In the embodiment of FIG. 2, video camera 33 detects an input image and produces a scanned output, which is passed to vector quantizer and codeword selector 34, which is like the selector 14 of FIG. 1. The output of the selector 34 is passed to the channel noise resistant, binary index selector 35, which contains a binary index coder 36 like binary index coder 16 of FIG. 1, and a binary index codebook, the contents of which are generated by the method of our invention, as will be described hereinafter. The output of the binary index selector 36 is injected into the noisy communication channel.

In the receiver 32, the binary index decoder 41 and codeword decoder 43 are like the corresponding decoder 21 and decoder 23 of FIG. 1; and binary codebook 42 has the same contents, also generated by our invention, as codebook 37 of transmitter 31.

In describing the operation of FIG. 2, we shall generalize the preceding description of the operation of FIG. 1, where appropriate and will point out certain specific differences, which are related to image, as opposed to speech, transmission.

It is desired to reduce the number of bits, or values, of information generated by quantizer and codeword selector 34 before transmission.

Further, the binary index selector 36, maps the codewords into binary indices in such a way as to make the results resistant to noise in the transmission channel.

The contents of binary index codebook 37 and 42 will be generated as follows, in order to enable coder 36 to do that, as shown in FIG. 3.

First, pick a codeword of the type generated by quantizer and codeword selector 34, which codeword has a high probability of occurrence and a low B-nearest-neighbor total distance.

Next, assign it a first binary index of length in bits equal to:

$$B = \log_2 N$$

where N is the greater length in bits of the codewords from generator 34.

Next, find the $\log_2 N$ nearest neighbors of the first codeword in the appropriate "proximity space."

The nature of the distance by which proximity is measured merits some discussion in the cases of coding of speech signals and visual images.

To appreciate the nature of the so-called vector quantization occurring here, visualize the array of points or spots which make up the raster of a television screen. We start in the upper left hand corner and take a 4×4 array of such spots. We can code the white, black, or multi-level grey value of all 16 spots in one codeword generated by the codeword selector. Such codewords may be chosen for an overall economy of bits and also to provide a logical small difference of bit patterns, which may be like a PAM pulse train generated by a systematic scan of the sixteen spots, for such patterns of spots which are very, very similar. The degree of similarity, or "proximity" of the patterns of spots is measured by a large number of empirical tests of how such patterns are perceived by human subjects. In all other respects the mathematics of the situation is essentially identical to that described above for FIG. 2.

Fourth, to those "nearest neighbor" codes (in terms of the similarity of the arrays of spot patterns) assign binary index codes differing from the first binary index code only in any one bit.

Fifth, repeat the foregoing steps for a residual high probability codeword, while avoiding duplicate assignments of binary index codes.

Next, again repeat the steps 1-4 until for some relatively high probability codeword, no suitable nearest neighbors (in terms of perception upon decoding) can be found or can be assigned a binary index code differing in only bit from the lead codeword of the intended group.

At this point, assign the residual binary index codes to the residual, relatively isolated, codewords of the set selectable by codeword selector 34.

Given the foregoing type of assignment of the binary index codes in transmitter 31, and the use of the same code assignments in codebook 42 of receiver 32, the display achieved by display apparatus 46 will be resistant to the effects of noise in the chanel between transmitter 31 and receiver 32.

An optional addition to the method involves local perturbations in the index assignment to test for marginally better assignments.

In illustrative computer simulations, the foregoing technique resulted in signal-to-noise ratio gains on the order of 4 db over a random index assignment technique, for B=6.

The foregoing method for assigning binary indices is believed to be substantially equivalent to other variations based on the notions of codeword probability and inter-codeword distance. In particular, an alternative technique is one which begins by assigning widely different indices to codewords of large mutual distance and continues that basic procedure until all codewords are assigned binary indices.

Other embodiments of the invention based on the foregoing teaching can be envisioned for low-bit-rate information storage, for example, in systems subject to noise or the type of degradation that typically affected only one bit in a binary index codeword. In general, the invention is preferred for applications in which the vector-quantized information is transmitted into the channel without further manipulation or filtering.

An example of the less preferred application is a system in which the speech excitation signal of FIG. 1 is itself vector-quantized and subsequently processed by the LPC filter to produce a speech signal. If the filtering of the vector-quantized excitation is confined to a reasonably modest set of standard LPC filters, the method of this invention can still be used after a suitable mapping of codevector proximities from the excitation domain to the speech signal domain.

What is claimed is:

1. A method of the type employing the assigning of binary index codes to codewords representing vector quantized information, for transmission in a communication system characterized in that the assigning includes the steps of picking a first codeword having a high probability of occurrence and low inter-codeword distance during system operation, assigning a first binary index code to the first codeword, finding the nearest neighbor codewords, in terms of some logical proximity of the nearest neighbor codewords to the first codeword, assigning to at least some of the nearest neighbor codewords binary index codes differing from the first binary index code only in any one bit, repeating the foregoing steps as many times as needed for successive residual high probability codewords, while avoiding duplicate assignments until no suitable group of neighboring codewords remain, and assigning residual binary index codes to residual codewords.

2. A method according to claim 1 characterized in that the finding step includes measuring the distance or proximity of the nearest neighbor codewords in terms of some perceptually-related similarity of the underlying codewords, such that the decoded information will be perceived to be resistant to noise occurring during transmission in the communication system, provided that the stored assignment information is employed in such a system in which noise typically affects only one bit in any affected binary index code.

3. A method according to claim 2 characterized in that the communication system is a linear predictive coding (LPC) type of speech transmission system, and the finding step includes measuring the underlying sound similarities of the groups of LPC parameter samples, where each group of samples has been vector quantized together.

4. A method according to claim 2 characterized in that the communication system is an image transmission type of system, and the finding step includes measuring the underlying spot pattern similarities, as perceived, of groups of spots of image intensity or chrominance, where each group of spots has been vector quantized together.

5. A method according to claim 3 or 4 characterized in that the picking step includes measuring the probability of occurrence ofa codeword as well as the total distance of B-nearest-neighbor codewords, where distances are measured in terms of perceptually-related proximity.

6. Communication equipment of the type including means for assigning binary index codes to codewords representing vector quantized information to be communicated,
characterized in that the means for assigning includes
means for picking a first codeword having a high probability of occurrence and low inter-codeword distance,
means for assigning a first binary index code to the first codeword,
means for finding the nearest neighbor codewords, in terms of some logical proximity of the nearest neighbor codewords to the first codeword,
means for assigning to at least some of the nearest neighbor codewords binary index codes differing from the first binary index code only in any one bit,
means for processing successive residual high probability codewords through the preceding three means, including means for avoiding duplicate assignments, and
means for assigning residual binary index codes to residual codewords having no suitable residual nearest neighbor codewords.

* * * * *